United States Patent
Yasuda et al.

(10) Patent No.: US 12,438,530 B2
(45) Date of Patent: Oct. 7, 2025

(54) IR DROP COMPENSATION

(71) Applicant: INTERNATIONAL BUSINESS MACHINES CORPORATION, Armonk, NY (US)

(72) Inventors: Takeo Yasuda, Nara (JP); Atsuya Okazaki, Setagaya-ku (JP)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 18/542,854

(22) Filed: Dec. 18, 2023

(65) Prior Publication Data

US 2025/0202461 A1 Jun. 19, 2025

(51) Int. Cl.
- *H03K 5/01* (2006.01)
- *G01R 27/16* (2006.01)
- *H03K 17/687* (2006.01)

(52) U.S. Cl.
CPC ............... *H03K 5/01* (2013.01); *G01R 27/16* (2013.01); *H03K 17/687* (2013.01)

(58) Field of Classification Search
CPC ........ H03K 5/01; H03K 17/687; G01R 27/16; G05F 1/10; G05F 1/46; G05F 1/461; G05F 1/462; G05F 1/467; G05F 1/66; G05F 1/56; G05F 1/563; G05F 1/565; G05F 1/569; G05F 1/575; G05F 1/59; G05F 1/618; G05F 3/02; G05F 3/08; G05F 3/10; G05F 3/16

See application file for complete search history.

(56) References Cited

U.S. PATENT DOCUMENTS

| | | | |
|---|---|---|---|
| 6,498,469 B2 | 12/2002 | Kobayashi | |
| 7,135,842 B2 | 11/2006 | Banerjee | |
| 2007/0162770 A1 | 7/2007 | Barrows | |
| 2018/0076708 A1 | 3/2018 | Bulzacchelli | |
| 2021/0209282 A1 | 7/2021 | Liu | |
| 2023/0384809 A1* | 11/2023 | Chen | G05F 1/575 |

FOREIGN PATENT DOCUMENTS

| | | |
|---|---|---|
| EP | 0627807 B1 | 8/1998 |
| FR | 2604569 B1 | 10/1991 |

OTHER PUBLICATIONS

Sofer, et al., "Active System for Compensation for IR Drops," 2008 IEEE International Conference on Microwaves, Communications, Antennas and Electronic Systems, May 13-14, 2008, 6 pages.

* cited by examiner

*Primary Examiner* — Jung Kim
(74) *Attorney, Agent, or Firm* — Jared C. Chaney

(57) ABSTRACT

A system may include a power supply or regulator connected to a target block with a ground line and a power line, a first switch in the power line, a sense line connected between the power supply for the regulator and a sense point on the power line at the target block side of the first switch, a second switch in the sense line, a third switch connected between the power line at the target block side of the first switch and the ground line, and a control circuit for generating a control signals to the first switch, the second switch, and the third switch.

8 Claims, 6 Drawing Sheets

IR DROP COMPENSATION

BACKGROUND

Aspects of the present disclosure relate to IR in electronics. IR drop refers to the electrical potential difference between the two ends of a conducting line during a current flow. The voltage drop across a line with a resistance value is the product of current (I) passing through resistance and resistance value (R).

A high-power multi-voltage system is a complex electrical system designed to efficiently manage electricity and deliver it in a range of voltages. High-power multi-voltage systems offer scalability and flexibility to adapt to changing energy demands, integrating renewable energy sources and emphasizing safety and reliability through advanced protective measures and maintenance protocols.

BRIEF SUMMARY

The present disclosure provides a method, computer program product, and system of compensation for IR drop, for example drop caused by parasitic resistances. Some embodiments of the present disclosure can be illustrated by a system comprising power supply or regulator connected to a target block with a ground line and a power line configured for IR drop compensation; a first switch inserted in the power line close to the target block; a sense line connected between a sense input of the power supply or regulator and a sense point on the power line beyond the first switch; a second switch inserted in the sense line, a third switch connected between the power line at a target block side of the first switch and the ground line; and a control circuit for generating control signals to the first switch, the second switch, and the third switch.

Some embodiments of the present disclosure can also be illustrated by a method, the method includes monitoring an IR drop of a power line with a sense line, wherein the power line is configured to compensate IR drop and provide target power line voltage to a load in a target block in active mode, and wherein the sense line is connected between a sense input of the power supply or regulator and a sense point of the power line at the target block side; compensating for the IR drop in active mode; turning a third switch on a sink line OFF; and turning a first switch on the power line and a second switch on the sense line ON. Except in active mode, the power supply voltage from a power supply or a regulator output is controlled within a defined level, wherein the defined level is almost same as target power line voltage and is configured to protect the power supply or regulator output in sleep mode and inactive mode; turning the first switch on the power line and the second switch on the sense line OFF; and turning the third switch on the sink line ON.

Some embodiments of the present disclosure can also be illustrated by a system comprising a memory storing program instructions; and a processor in communication with the memory, the processor being configured to execute the program instructions to perform processes comprising monitoring an IR drop of a power line with a sense line, wherein the power line is configured to provide power to a load in a target block, and wherein the sense line is connected to the power line at a load side of a first switch on the power line, compensating for the IR drop when the system is in active mode, turning a third switch on a sink line OFF; and turning the first switch on the power line and a second switch on the sense line ON. On the other hand, a power supply voltage from a power supply or a regulator output is controlled within a defined level, wherein the defined level is almost same as target power line voltage and is configured to protect the power supply or regulator output in sleep mode and inactive mode; turning the first switch on the power line and the second switch on the sense line OFF; and turning the third switch on the sink line ON.

DETAILED DESCRIPTION

Figure 1:
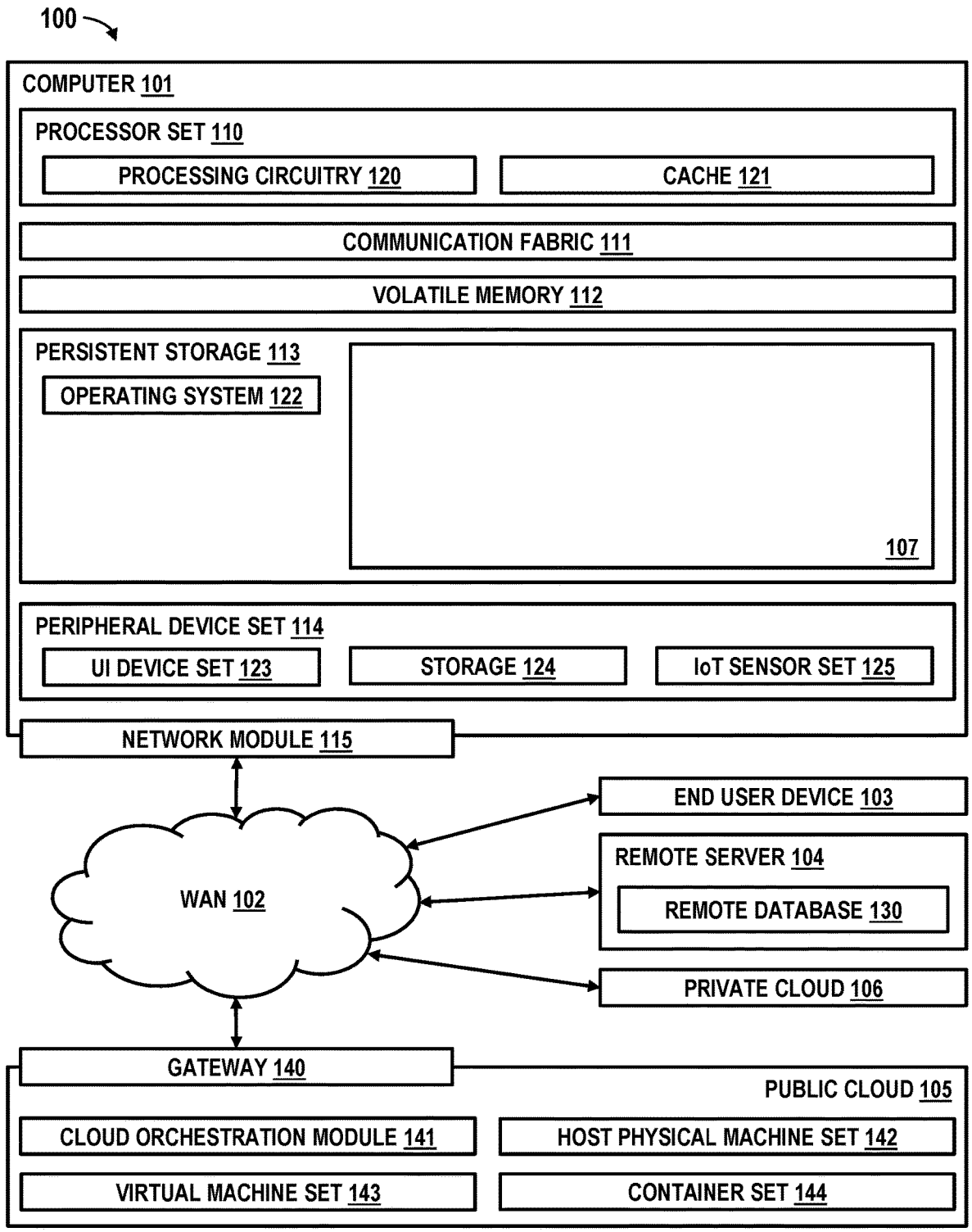
FIG. 1 illustrates an example computing environment, according to various embodiments of the present invention.

Aspects of the present disclosure relate to IR drop compensation. While the present disclosure is not necessarily limited to such applications, various aspects of the disclosure may be appreciated through a discussion of various examples using this context.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as block 107 (e.g., code to enact method 400) for IR drop compensation in power systems. In addition to block 107, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 107, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 107 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid-state storage devices. Operating system 122 may take several forms, such as various known proprietary operating systems or opensource Portable Operating System Interface type operating systems that employ a kernel. The code included in block 107 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Modern computer systems require an integrated power supply system that can handle large current loads insofar as power feeds every transistor within a chip. As fabrication technologies have become smaller, the size of the wires has also become smaller, while physical chip dimensions have stayed roughly the same. This means that wires have become thinner but have not gotten shorter which leads to g considerable parasitic resistance on the wires to cause non-negligible IR drop. This is especially remarkable for power line because current flowing through power line wire is much larger than that flowing through other lines. In some instances, a power module card (or board) with multiple regulators is recommended to supply multiple power voltages in limited space. The power lines (e.g., nets) are turned ON and OFF quickly to implement power-up and power-down sequences or mode switches between active and sleep & inactive configurations for various components requiring power.

In some instances, turning ON and OFF a power line may be achieved with switch devices such as Field-Effect Transistors (FETs) or Transfer gates (T-gates) because switching between enabling and disabling a power supply or a regulator takes time and is not suitable for implementing the power-up/power-down sequence or quick mode switch.

IR drop is the voltage drop through a resistance. When the power supply voltage of transistor drops, operation speed of the transistor slows down and this can affect operation speed of the circuit. If the transistor is in a critical path of a chip design, it can also cause performance failure and should therefore be avoided. For a large current supply, IR drop at ON resistance of switch devices and parasitic resistance of power lines, are significant (e.g., not negligible). In some instances, compensation for the IR drop to minimize degradation of power integrity for the target block (system, module, or chip) would be essential.

In some embodiments, a power line connection with end-to-end IR drop compensation is proposed.

Figure 2:
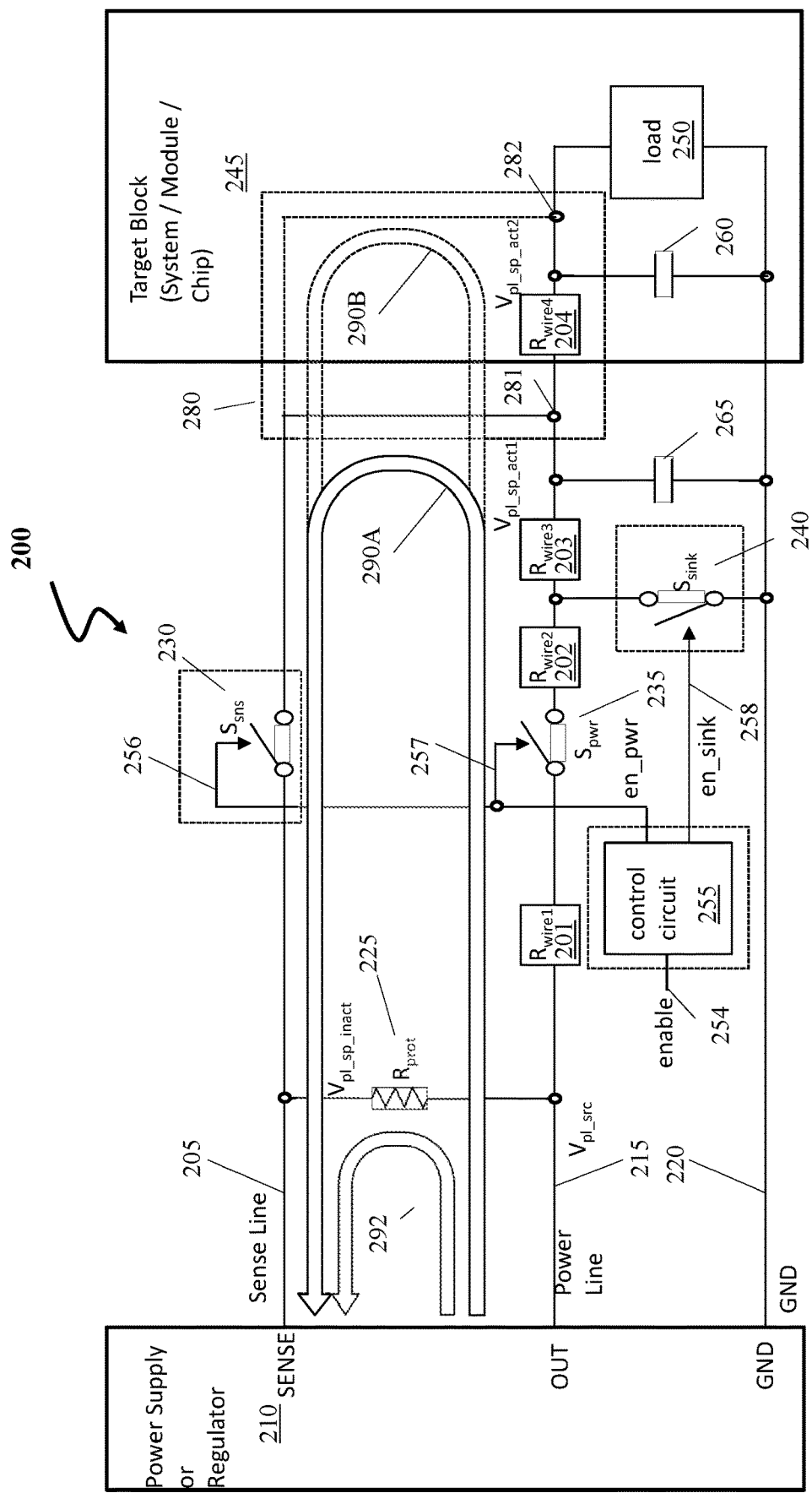
FIG. 2 illustrates an example power line with IR drop compensation, according to various embodiments of the present invention.

FIG. 2 depicts an example power line connection 200 with end-to-end IR drop compensation. In some embodiments, the power line connection may include example components as described below. In some embodiments, operations performed by the one or more components of example power line connection 200 may be enacted by one or more computing environments such as the system described in FIG. 1 above.

In some embodiments, sense line 205 is a connection used to monitor the voltage at a specific point in an electrical circuit. In some instances, sense line 205 provides feedback to a power supply or regulator 210 to ensure that the voltage remains within desired limits. In some embodiments, a power supply or regulator 210 may be or include one or some power supply instrument(s) or one or some regulator block(s) or one or some similar component(s).

In some embodiments, the power supply or regulator 210 is an electronic component or circuit that maintains a stable output voltage for a required amount of current, regardless of changes in the required amount of current due to variation of load conditions. The power supply or regulator 210 is used to provide a steady power supply to a load 250 in a target block 245. In some embodiments, the power supply or regulator 210 contains a power source (not depicted in the figures) and an IR drop sensor (not depicted in the figures).

In some embodiments, power line 215 carries electrical power (voltage and current) from a source to various components in the circuit. In some embodiments, sense line 205 is connected to power line 215 through sense line switch 230 at the load 250 side of power line switch 235, that is, sense point 281 or sense point 282 shown in box 280 when both sense line switch 230 and power line switch 235 are ON. In some instances, box 280 shows two different embodiments of the sense point connection. In some instances, the connection may be outside of target block 245, shown by connection at sense point 281. In some instances, the connection may be inside of target block 245, shown by connection at sense point 282. For example, it is better to have the sense line 205 connected to the power line 215 as close to the load 250 as possible because the maximum amount of IR drop caused by parasitic resistance on the power line 215 can be compensated. With sense point 282, this scheme can compensate the IR drop on power line switch 235 and from $R_{wire1}$ 201 to $R_{wire4}$ 204, while with sense point 281, it can compensate the IR drop on power line switch 235 and from $R_{wire1}$ 201 to $R_{wire3}$ 203. The IR drop on more wiring resistances can be compensated for closer sense point to the load 250. However, complexities of manufacturing target block 245 with an integrated sense line connection may make a sense line connection outside of target block 245 more feasible.

In some embodiments, ground line (GND) 220 is the reference point in an electrical circuit.

In some embodiments, protection resistor ($R_{prot}$) 225 is a resistor added to a circuit to protect power supply or regulator 210. $R_{prot}$ 225 makes a sense loop 292 from an output of power line 215 (OUT port) of the power supply or regulator 210 to an input of sense line 205 (SENSE port) of the power supply or regulator 210 even when both power line switch 235 and sense line switch 230 are OFF.

In some instances, $R_{prot}$ 225 is used as a component in a voltage sense loop (e.g., inactive loop 292) for keeping the power line voltage close to target power line voltage in case the power line switch 235 and the sense line switch 230 are in OFF state such as inactive mode or sleep mode. Without $R_{prot}$ 225, when the power line switch 235 and the sense line switch 230 are OFF, the power supply or regulator 210 senses a large IR drop because sense line 205 is open (disconnected to any sense point). In this case, an output of power line 215 of the power supply or regulator 210 would be an uncontrollably high level which could damage the power supply or regulator 210.

In some embodiments, sense line switch ($S_{sns}$) 230 is a switch for the sense line 205. This line is monitored by the voltage sensor included in the power supply or the regulator 210 to detect the amount of IR drop. The power supply or regulator 210 controls power line output (OUT port) so that the sense line voltage approaches the target power line voltage (to make the amount of IR drop zero).

In some embodiments, power line switch ($S_{pwr}$) 235 is a switch for the power line 215. In some embodiments, sense line switch ($S_{sns}$) 230 and power line switch ($S_{pwr}$) 235 may be turned ON or OFF at the same time or approximately the same time with same signal en_pwr (256 and 257, respectively). In some embodiments, the power supply or regulator 210 will always have a sense loop (e.g., inactive loop 292 or active loop 290A/290B) from the power line 215 output (OUT port) to the sense line 205 input (SENSE port) through either protection resistor $R_{prot}$ 225 (when both the power line switch 235 and the sense line switch 230 are OFF) or through parasitic resistances from $R_{wire1}$ 201 to $R_{wire3}$ 203 (or $R_{wire4}$ 204) and ON resistance of power line switch 235 which cause IR drop (when both the power line switch 235 and the sense line switch 230 are ON). In some embodiments, 290A shows an example in which the sense point on the power line is 281 which is placed s as close to target block 245 as possible. This type of embodiments can compensate IR drop by the ON resistance of power line switch 235 and wiring parasitic resistances $R_{wire1}$ 201, $R_{wire2}$ 202 and $R_{wire3}$ 203. In some embodiments, 290B shows an example in which the sense point on the power line is 282 which is placed inside the target block. This type of embodiments can compensate IR drop by the ON resistance of power line switch 235 and wiring parasitic resistances $R_{wire1}$ 201, $R_{wire2}$ 202, $R_{wire3}$ 203 and $R_{wire4}$ 204. Decreasing the distance between the sense point and the load 250 increases the amount of the IR drop compensation and reduces the amount of the IR drop at the load 250 which leads to improves the system operation performance and integrity. In some embodiments, sink switch ($S_{sink}$) 240, is a switch that may be turned ON to discharge the power line 215 by sinking current from power line 215 when power line switch ($S_{pwr}$) 235 and sense line switch ($S_{sns}$) 230 are OFF. In some instances, sink switch ($S_{sink}$) 240 is connected between power line 215 at the target block 245 side of power line switch ($S_{pwr}$) 235 and the GND 220.

In some embodiments, target block 245 is a component, system, module, or chip in power line connection 200 that is the focus of analysis, measurement, or control.

In some embodiments, load 250 is a device or component that consumes electrical power from a power source. For example, load 250 can be a resistor, a motor, an LED, or any other electrical device that uses electricity to perform a specific function or combination of some of them.

In some embodiments, control circuit 255 is a set of components or logic that manages the operation of a system. For example, control circuit 255 includes logic gates and delay blocks to generate control signals from a user or external system requirements such as an enable signal. In some embodiments, generated control signal lines 256, 257, and 258 are used to turn ON and OFF switches $S_{sns}$ 230, $S_{pwr}$ 235, and $S_{sink}$ 240, respectively.

In some embodiments, during active mode, de-coupling capacitances 260, 265 and internal capacitances in load 250 are used in order to keep the power line voltage at the sense point at or near (e.g., within 5% tolerance depending on the application) the target power line voltage level which requires charging and discharging above capacitances with a certain amount of supply current and time. Power supply or regulator 210 supplies this current to charge the power line 215 to keep power line voltage at any sense point (281 or 282) to target voltage level. During inactive and sleep modes, switch $S_{sink}$ 240 pulls current to discharge the load side of power line 215, which is disconnected with the power line output (OUT port) of the power supply or regulator 210 by switch $S_{pwr}$ 235.

Figure 3:
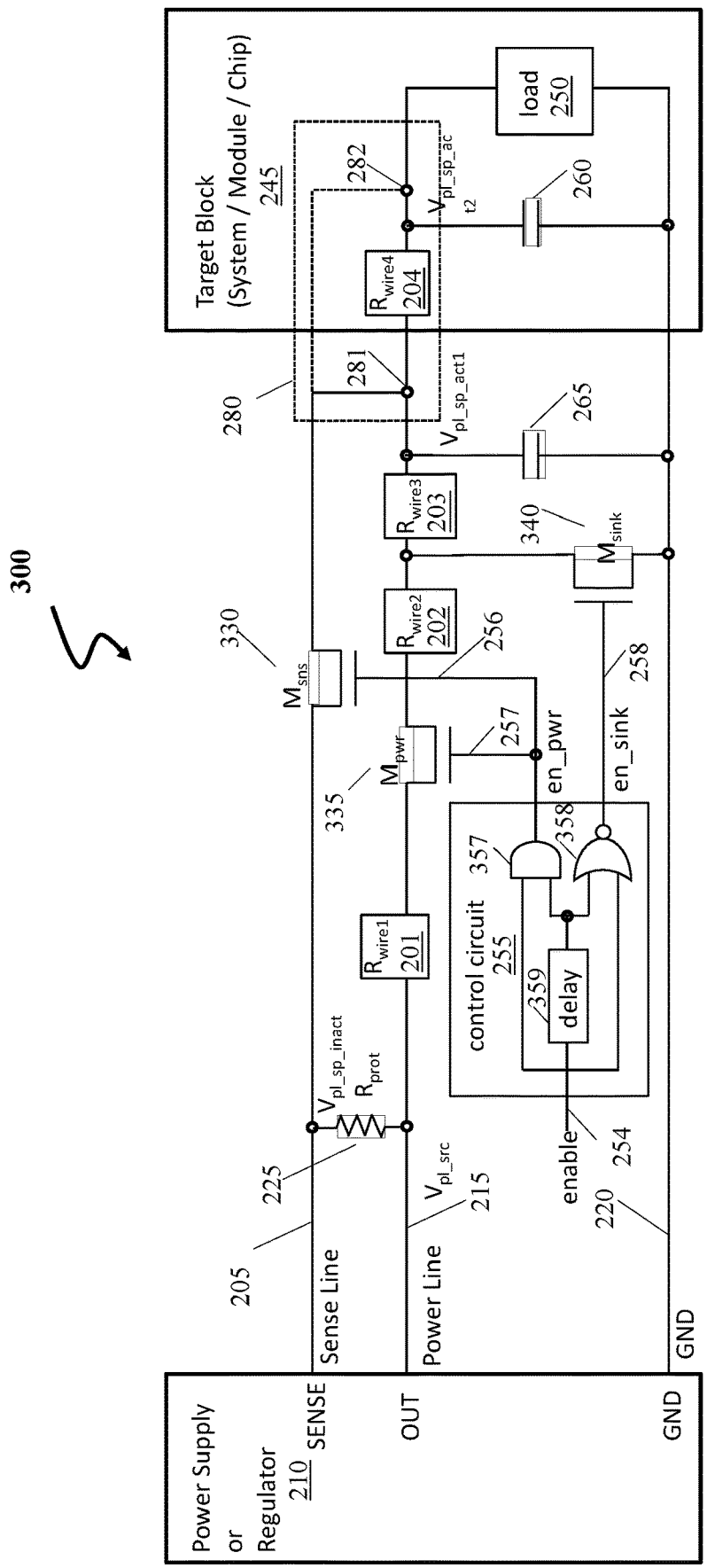
FIG. 3 illustrates a detailed example power line with IR drop compensation, according to various embodiments of the present invention.

FIG. 3 depicts an detailed example power line connection 300 with end-to-end IR drop compensation. In some embodiments, the power line connection may include example components such as those described in FIG. 2 above and as described below. In FIG. 3 switches $S_{sns}$ 230, $S_{pwr}$ 235 and $S_{sink}$ 240 in FIG. 2 are implemented with MOSFETs (a kind of transistor).

In some embodiments, $M_{sns}$ 330 operates as a switch for connecting or disconnecting the sense line 205 between the SENSE port of power supply or regulator 210 and the sense point (281 or 282) near the target block or the load 250.

In some embodiments, $M_{pwr}$ 335 operates as a switch for connecting or disconnecting the power line 215 between the OUT port of power supply or regulator 210 and power line for the load 250.

In some embodiment, the devices $M_{sns}$ 330 and $M_{pwr}$ 335 may be turned ON or OFF at the same time or approximately the same time (e.g., may have the same ON/OFF state). In some embodiments, the power supply or regulator 210 will always have a sense loop feedback from the power line 215 output (OUT port) to sense line 205 input (SENSE port) through either protection resistor $R_{prot}$ 225 (when the both devices $M_{pwr}$ 335 and $M_{sns}$ 330 are OFF) or through a load side sense point in box 280 (when the both devices $M_{pwr}$ 335 and $M_{sns}$ 330 are ON). The value of protection resistor $R_{prot}$ 225 is much larger than the total value of parasitic resistance 201, 202, and/or 203 (and/or 204). Even with $R_{prot}$ 225 connected, in case both devices 335 and 330 are turned ON, almost all of the power line 215 current from the power supply or regulator 210 flows through the parasitic resistances $R_{wire1}$ 201, $R_{wire2}$ 202, $R_{wire3}$ 203 and $R_{wire4}$ 204 side not through $R_{port}$ 225. Thus, in a case where both devices 335 and 330 are turned ON, correct IR drop compensation for parasitic resistance 201, 202, and 203 (and 204) is achieved and there is almost no effect from the protection resistor $R_{prot}$ 225.

In some embodiments, device 340 is device that may be turned ON to sink current for discharging the power line 215 quickly in a case where both devices 335 and 330 are turned OFF.

In some embodiments, devices $M_{sns}$ 330, $M_{pwr}$ 335, and $M_{sink}$ 340 are switches that are implemented with an electrical component such as a MOSFET (Metal-Oxide-Semiconductor Field-Effect Transistor). These devices can be implemented also with T-Gate (Transmission Gate) that switches the conductivity (open or short) between source and drain nodes with control signal supplied to its gate node. In some embodiments, control signal lines 256, 257, and 258 are control signals used to turn ON and OFF devices 330, 335, and 340, respectively. In some instances, MOSFETs and T-gates are electronic components that can operate as switches by controlling the flow of electrical current between two terminals (source and drain nodes) through the control voltage applied to a third terminal (gate node). MOSFETs, especially N-channel types, can be turned ON or OFF by applying a voltage above or below a threshold voltage to the gate node, respectively. T-gates are constructed with complementary N-channel and P-channel MOSFETs connected in parallel, and the T-gates switch ON when a control signal is high and OFF when the control signal is low, allowing or blocking current flow, respectively.

Figure 4:
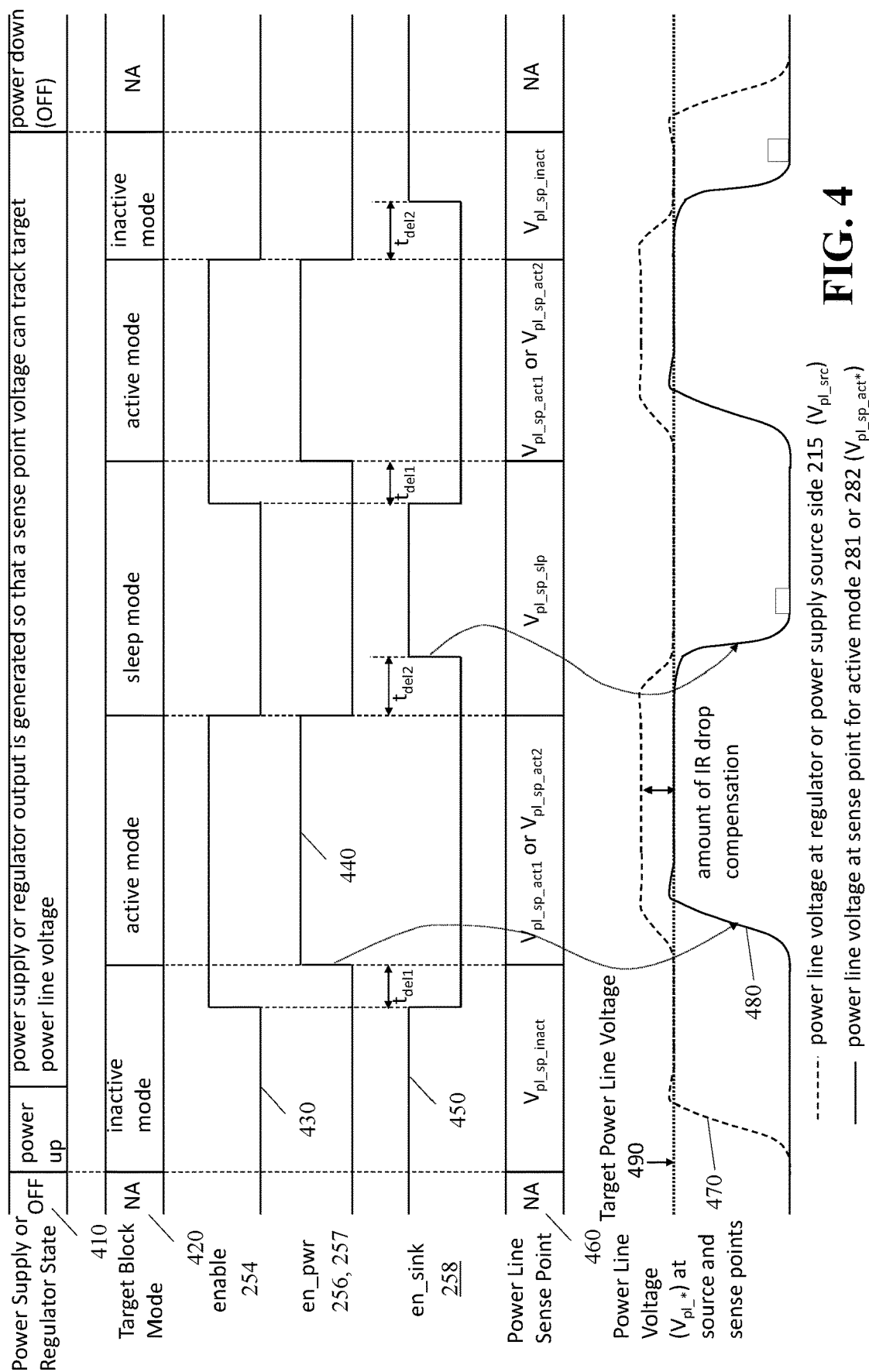
FIG. 4 illustrates an example operation timing for IR drop compensation sequence.

FIG. 4 shows timing diagram of this scheme. According to the state (depicted in row 410) of power supply or regulator 210 and enable signal 430 for enable 254 input given to the control circuit 255, the mode (depicted in row 420) of target block 245 is determined and switch signal 440 for en_pwr (256 and 257) and switch signal 450 for en_sink (258) are generated. In some embodiments, with the switch signals, the power line sense points (281, 282) or sense loop feedback through $R_{prot}$ 225 and power line discharge timing are determined. In some embodiments, the bar in row 460 shows the sense point on the power line during the operation. In some embodiments, the last two waveforms 470 and 480 show the power line voltages of the power supply or regulator 210 output (OUT port) at source side of power line 215 with dotted curve (470) and at sense point 281 or 282 with solid curve (480). In some embodiments, target power line voltage at load 250 is shown as a dotted straight line 490. IR dop at the sense point 281 or 282 caused by ON resistance of switch $S_{pwr}$ 235 or MOSFET $M_{pwr}$ 335 and parasitic resistances from $R_{wire1}$ 201 to $R_{wire3}$ 203 (or $R_{wire4}$ 204) are correctly compensated in active mode. In some embodiments, the power line voltage at power line 215 at power supply or regulator 210 side of power line switch $S_{pwr}$ 250 is kept to a target power line voltage during inactive and sleep modes. In some embodiments, two delay periods $t_{del1}$ and $t_{del2}$ are generated with logic gates 357 and 358 and delay block 359 in FIG. 3 to avoid wasting current by shorting power line 215 to GND 220.

Figure 5:
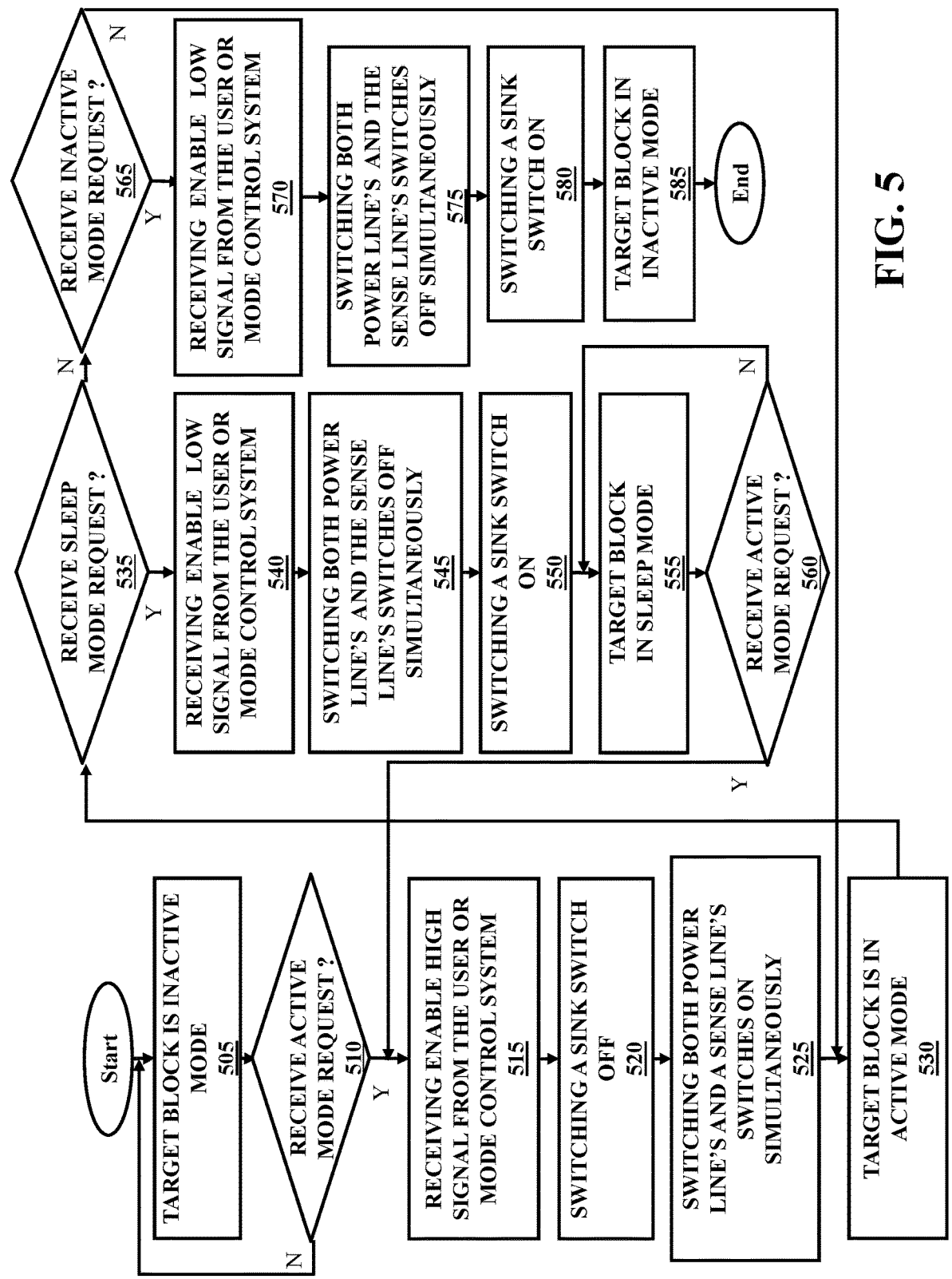
FIG. 5 illustrates an example method of IR drop compensation, according to various embodiments of the present invention.

FIG. 5 depicts an example method 500 for IR drop compensation. Operations of method 500 may be enacted by one or more computing environments such as the system described in FIG. 1 above.

Method 500 begins with operation 505 when target block is in an inactive mode.

Method 500 continues with operation 510 of checking whether an active mode request is received from a user or system program.

If so (510: YES), once power up is initiated, the control circuit receives an activated enable signal (high level enable 254 signal) and generates several internal control signals in operation 515 of method 500.

As soon as activated enable signal (high level enable 254 signal) is given, method 500 generates a sink switch OFF signal (low level en_sink 258 signal) to switch device S sink 240 device (e.g., $M_{sink}$ 340) at operation 520 to prevent current from flowing from the power line to the ground line directly.

In some embodiments, after a certain amount of delay $(t_{del1})$ (determined by the requirements of the system) from above operation in 520, method 500 generates switch ON signal (en_pwr) for power line switch $S_{pwr}$ 235 or device (e.g., $M_{pwr}$ 335) and for sense line switch $S_{sns}$ 230 or device (e.g., $M_{sns}$ 330) simultaneously in operation 525. In some instances, simultaneously means at or about the same time. For example, there may be a very small delay between turning each switch ON. In some embodiments, however, there may be an intentional delay $(t_{del1})$ between turning OFF the sink switch and turning ON the power line and sense line switches. In some instances, this intentional delay is meant to prevent the power line from directly connecting to the ground without any impedance. In some instances, when the power switch and the sensor switch are ON, the connection through the protection resistor $R_{prot}$ 225 is negligible because the wiring parasitic resistances ($R_{wire1}$ 201 $R_{wire2}$ 202, $R_{wire3}$ 203, $R_{wire4}$ 204) are much smaller than $R_{prot}$ 225. In this case, almost all of the current coming out from power supply or regulator 210 flows not through $R_{prot}$ 225 but through wiring resistances ($R_{wire1}$ 201 $R_{wire2}$ 202, $R_{wire3}$ 203, $R_{wire4}$ 204) and an IR drop can arise at sense point 281 (or 282) and it is compensated correctly even with $R_{prot}$ 225.

Method 500 makes target block stay in an active mode at operation 530 (or branching back into operation 530 from a NO determination at operation 565) until sleep mode or inactive mode request is received in operations 535 or 565, respectively.

Method 500 branches into sleep mode process (operations 540 to 555) if sleep mode request is received in operation 535.

Method 500 branches into inactive mode process (operations 570 to 585) if inactive mode request is received in operation 565.

Method 500 branches into active mode process if neither of above mode requests is received in operations 535 and 565 (e.g., 535: NO and 565: NO).

Method 500 receives deactivated enable signal (low level enable 254 signal) in the event that it branches into sleep mode in operation 540. In some embodiments, when the user or system requires that a load in the target block stops receiving power it may send a deactivated enable 254 signal to a control circuit.

Method 500 generates sense line and power line switch OFF signals (low level en_pwr 256, 257 signals) simultaneously at the beginning of sleep mode in operation 545. In some instances, simultaneously means at or about the same time. For example, there may be a small delay between turning each switch OFF. In some embodiments, even in the power line switch $S_{pwr}$ 235 or device (e.g., $M_{pwr}$ 335) and the sense line switch $S_{sns}$ 230 or device (e.g., $M_{sns}$ 330) OFF case, the sense loop for power supply or regulator 210 connecting the power line 215 and the sense line 205 still exists through protection resistor $R_{prot}$ 225. In some embodiments, the $R_{prot}$ 225 connection is important for preventing the output (OUT port) voltage of power supply or regulator 210 from being out of control level.

In some embodiments, after a certain amount of delay $(t_{del2})$ (determined by the requirements of the system) from operation 545, the method 500 generates sink switch $S_{sink}$ 240 or device (e.g., $M_{sink}$ 340) ON signal (high level en_sink 258 signal) at sleep mode in operation 550. In some instances, turning ON the sink switch $S_{sink}$ 240 or device (e.g., $M_{sink}$ 340) is executed to discharge the power line quickly. In some embodiments, there may be an intentional delay $(t_{del2})$ between turning OFF the power line switch $S_{pwr}$ 235 or device (e.g., $M_{pwr}$ 335) and sense line switch $S_{sns}$ 230 or device (e.g., $M_{sns}$ 330) and turning ON the sink switch $S_{sink}$ 240 or device (e.g., $M_{sink}$ 340). In some instances, this intentional delay is meant to prevent the power line from directly connecting to the ground without any impedance.

Method 500 makes the target block to stay in sleep mode at operation 555 (or branching back into operation 555) until active mode request is received in operation 560.

Method 500 branches into active mode process (operations 515 to 530) if an active mode request is received in operation 560.

Method 500 receives deactivated enable signal (low level enable 254 signal) in the event that it branches into inactive mode in operation 570. In some embodiments, when the user or system requires that a load in the target block stops receiving power it may send a deactivated enable 254 signal to a control circuit.

Method 500 generates sense line and power line switch OFF signals (low level en_pwr 256, 257 signals) simultaneously at the beginning of inactive mode in operation 575. In some instances, simultaneously means at or about the same time. For example, there may be a small delay between turning each switch OFF. In some embodiments, even in the power line switch $S_{pwr}$ 235 or device (e.g., $M_{pwr}$ 335) and the sense line switch $S_{sns}$ 230 or device (e.g., $M_{sns}$ 330) OFF case, the sense loop for power supply or regulator 210 connecting the power line 215 and the sense line 205 still exists through protection resistor $R_{prot}$ 225. In some embodiments, the $R_{prot}$ 225 connection is important for preventing the output (OUT port) voltage of power supply or regulator 210 from being out of control level.

In some embodiments, after a certain amount of delay $(t_{del2})$ (determined by the requirements of the system) from above operation 575, method 500 generates sink switch $S_{sink}$ 240 or device (e.g., $M_{sink}$ 340) ON signal (high level en_sink 258 signal) at inactive mode in operation 580. In some instances, turning ON the sink switch $S_{sink}$ 240 or device (e.g., $M_{sink}$ 340) is executed to discharge power line quickly. In some embodiments, there may be an intentional delay $(t_{del2})$ between turning OFF the power line switch $S_{pwr}$ 235 or device (e.g., $M_{pwr}$ 335) and sense line switch $S_{sns}$ 230 or device (e.g., $M_{sns}$ 330) and turning ON the sink switch $S_{sink}$ 240 or device (e.g., $M_{sink}$ 340). In some instances, this intentional delay is meant to prevent the power line from directly connecting to the ground without any impedance.

Method 500 makes target block stay in inactive mode at operation 585 until the power supply or regulator 210 starts power down.

In some embodiments, the sense line is connected to the power line near or in the target block. In some instances, near or close to means as close as reasonably possible given the limitations of manufacturing techniques. For example, the limitation of the manufacturing techniques may mean the closest point one component may be placed net to another is 0.1 mm. As the SENSE port of the power supply or regulator 210 ideally does not pull or push current, almost all of the current flowing through the power line is flowing into the load 250 or de-coupling capacitances 265 and 260. The IR drop for the power line between the power supply or regulator 210 and the load 250 is much larger than the IR drop for the sense line between the power supply or regulator 210 and the load 250 because the current flowing through the power line is much larger than the current flowing through sense line. This means IR drop on the sense line is negligible.

Figure 6:
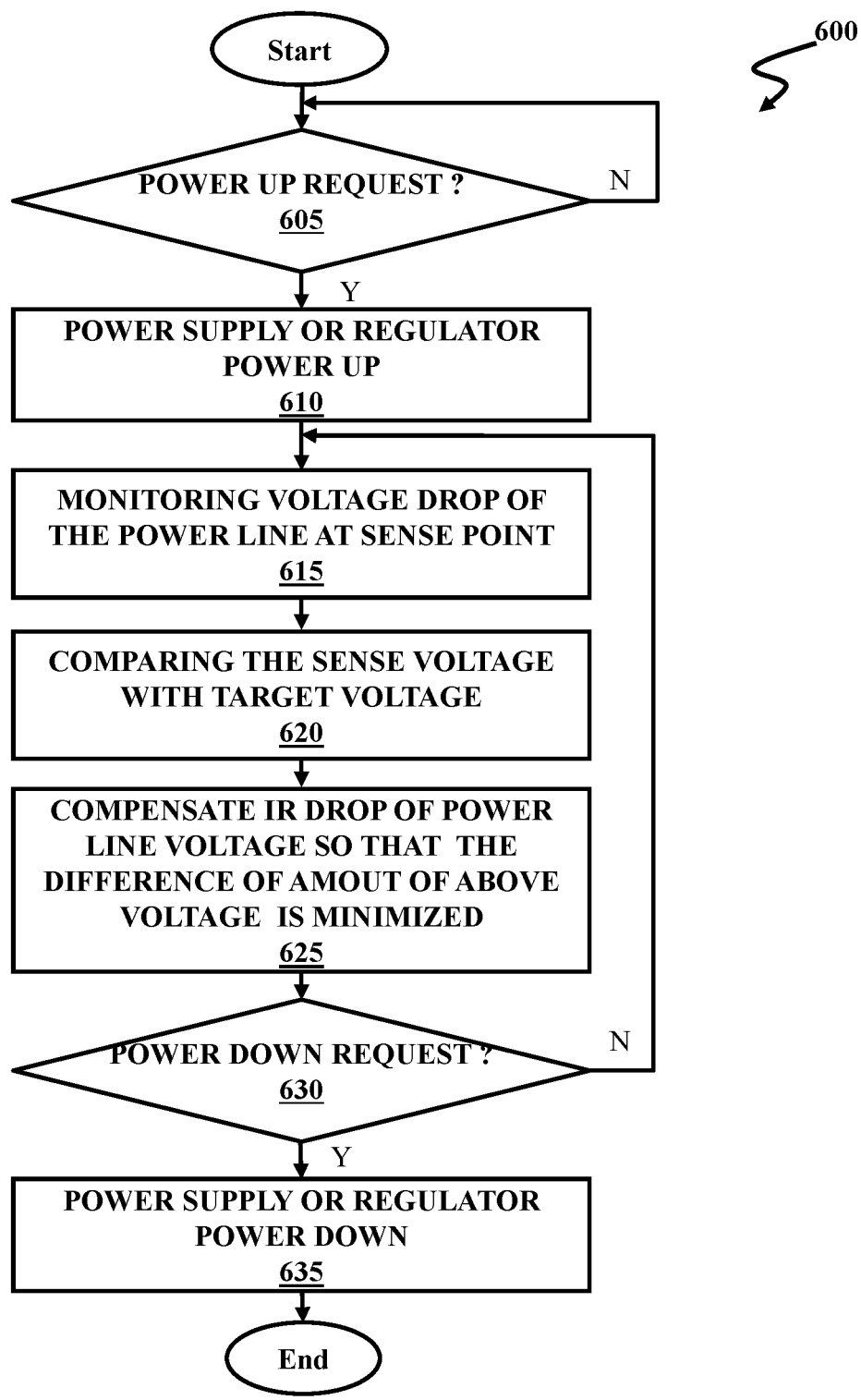
FIG. 6 illustrates an example method of power supply or regulator operation, according to various embodiments of the present invention.

FIG. 6 depicts an example method 600 for power supply or regulator 210. Operations of method 600 may be enacted by one or more computing environments such as the system described in FIG. 1 above.

Method 600 begins with operation 605 to determine if a power up request has been initiated or not. In some embodiments, once power up is initiated, a power supply or regulator 210 can power up and supply current with a required voltage in operation 610. In operation 615, power supply or regulator 210 can monitor IR drop (e.g., voltage drop) of the power line at sense point near the target block 245 or the load 250 using a sense line input. In some embodiments, the power supply or regulator 210 continuously (during operation) monitors the voltage on the power line at sense point with the sense line to detect IR drop.

Method 600 continues with operation 620 of comparing the monitored power line voltage through sense line input with a target power line voltage.

Method 600 continues with operation 625 of compensating for an IR drop of the power line so that the above comparison result (the difference of the monitored power line voltage and the target power line voltage) is minimized or reduced.

Method 600 checks if a power down request is given by a user or system program in operation 630.

If not (630: NO), then the method 600 returns to operation 615. If so (630: YES), then the method proceeds to operation 635. Method 600 ends at operation 635 by powering down the power supply or regulator 210 in response to a power down request being detected in the operation 630.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

In some embodiments, a system may comprise a power supply or regulator connected to a target block with a ground line and a power line configured for IR drop compensation; a first switch inserted in the power line close to the target block; a sense line connected between a sense input of the power supply or the regulator to a point on the power line beyond the first switch; a second switch inserted in the sense line, a third switch connected between the power line at a target block side of the first switch and the ground line; and a control circuit for generating control signals to the first switch, the second switch, and the third switch.

In some embodiments, the system may further comprise a protection resistor between the power line and the sense line at a power supply or regulator side of the first switch and the second switch, wherein the protection resistor is configured to create a sense loop when the first switch and the second switch are in an OFF state.

In some embodiments, the second switch has the same ON/OFF state as the first switch and the third switch has an opposite ON/OFF state as the first switch.

In some embodiments, there is a first delay between turning the third switch OFF and turning the first and second switch ON and there is a second delay between turning the first and second switch OFF and turning the third switch ON.

In some embodiments, wherein the sense line is connected to the power line at a first sense point $V_{pl\_sp\_act1}$ close to the target block.

In some embodiments, wherein the sense line is connected to the power line at a second sense point $V_{pl\_sp\_act2}$ close to the load inside the target block.

In some embodiments, wherein the first switch, the second switch, and the third switch are MOSFETs (Metal-Oxide-Semiconductor Field-Effect Transistors).

In some embodiments, wherein the first switch, the second switch, and the third switch are T-Gates (Transmission Gates).

In some embodiments, a system may comprise a memory storing program instructions; and a processor in communication with the memory, the processor being configured to execute the program instructions to perform processes comprising monitoring an IR drop of a power line with a sense line, wherein the power line is configured to provide target voltage to a load in a target block, and wherein the sense line is connected to the power line at a load side of a first switch on the power line, compensating for the IR drop when the system is in active mode, turning a third switch on a sink line OFF; and turning the first switch on the power line and a second switch on the sense line ON, wherein a power supply voltage from a power supply or regulator output is controlled within a defined level, wherein the defined level is configured to protect the regulator output in sleep mode and inactive mode; turning the first switch on the power line and the second switch on the sense line OFF; and turning the third switch on the sink line ON.

In some embodiments, the memory stores further program instructions, and wherein the processor is configured to execute the further program instructions to perform the processes further comprising maintaining a sense loop of the power line and the sense line through a resistor connecting the power line and the sense line when the first switch and the second switch are OFF.

In some embodiments, wherein the second switch has the same ON/OFF state as the first switch and the third switch has an opposite ON/OFF state as the first and second switches.

In some embodiments, wherein there is a delay between turning the third switch OFF and turning the first and second switches ON and there is another delay between turning the first and second switch OFF and turning the third switch ON.

In some embodiments, wherein the sense line is connected to the power line at a first sense point $V_{pl\_sp\_act1}$ close to the target block.

In some embodiments, wherein the sense line is connected to the power line at a second sense point $V_{pl\_sp\_act2}$ close to the load inside the target block.

In some embodiments, a method may comprise monitoring an IR drop of a power line with a sense line, wherein the power line is configured to provide target voltage to a load in a target block, and wherein the sense line is connected between a sense input of the power supply and a sense point of the power line at the target block side; compensating for the IR drop when an active mode is triggered; turning a third switch on a sink line OFF; and turning a first switch on the power line and a second switch on the sense line ON, wherein a power supply voltage from a regulator output is controlled within a defined level, wherein the defined level is configured to protect power supply or regulator output in sleep mode and inactive mode; turning the first switch on the power line and the second switch on the sense line OFF; and turning the third switch on the sink line ON.

In some embodiments, the method further comprises maintaining a sense loop of the power line and the sense line through a resistor connected to the power line and the sense line when the first switch and the second switch are OFF.

In some embodiments, wherein the second switch has the same ON/OFF state as the first switch, and the third switch has an opposite ON/OFF state as the first switch.

In some embodiments, wherein there is a delay between turning the third switch OFF and turning the first and second switch ON and there is another delay between turning the first and second switches OFF and turning the third switch ON.

In some embodiments, wherein the sense line is connected to the power line at a first sense point $V_{pl\_sp\_act1}$ close to the target block.

In some embodiments, wherein the sense line is connected to the power line at a second sense point $V_{pl\_sp\_act2}$ close to the load inside the target block.

What is claimed is:

1. A system comprising:
   a regulator connected to a target block with a ground line and a power line configured for IR drop compensation;
   a first switch inserted in the power line close to the target block;
   a sense line connected between a sense input of the power line or the regulator to a point on the power line beyond the first switch;
   a second switch inserted in the sense line;
   a third switch connected between the power line at a target block side of the first switch and the ground line; and
   a control circuit for generating a control signal to the first switch, the second switch, and the third switch.

2. The system of claim 1, further comprising:
   a protection resistor between the power line and the sense line at a regulator side of the first switch and the second switch, wherein the protection resistor is configured to create a sense loop when the first switch and the second switch are in an OFF state.

3. The system of claim 1, wherein the second switch has a same ON/OFF state as the first switch and the third switch has an opposite ON/OFF state as the first switch.

4. The system of claim 1, wherein there is a first delay between turning the third switch OFF and turning the first switch ON and there is a second delay between turning the first switch OFF and turning the third switch ON.

5. The system of claim 1, wherein the sense line is connected to the power line at a sense point inside the target block and before a load in the target block.

6. The system of claim 1, wherein the sense line is connected to the power line at a second sense point proximate to the target block.

7. The system of claim 1, wherein the first switch, the second switch, and the third switch are MOSFETs (Metal-Oxide-Semiconductor Field-Effect Transistors).

8. The system of claim 1, wherein the first switch, the second switch, and the third switch are T-Gates (Transmission Gates).

\* \* \* \* \*